United States Patent [19]

McKale

[11] Patent Number: 5,012,199

[45] Date of Patent: Apr. 30, 1991

[54] MULTI-STAGE MUSICAL INSTRUMENT AMPLIFIER HAVING DISTORTION MODES

[75] Inventor: George A. McKale, St. Louis, Mo.

[73] Assignee: St. Louis Music, Inc., St. Louis, Mo.

[21] Appl. No.: 404,595

[22] Filed: Sep. 8, 1989

[51] Int. Cl.$^5$ ............................................. H03G 3/08
[52] U.S. Cl. ...................................... 330/51; 330/86; 330/145; 381/61
[58] Field of Search .................. 330/51, 86, 144, 145, 330/129, 282, 284; 84/701; 381/61, 104, 106, 109, 118

[56] References Cited

U.S. PATENT DOCUMENTS

| | | | |
|---|---|---|---|
| 3,860,876 | 1/1975 | Woods | 328/167 |
| 3,973,461 | 8/1976 | Jahns | 84/1.24 |
| 4,002,994 | 1/1977 | Fender | 330/107 |
| 4,150,253 | 4/1979 | Knoppel | 179/1 R |
| 4,164,163 | 8/1979 | Rhodes | 84/1.15 |
| 4,175,465 | 11/1979 | Schmoll, III | 84/1.26 |
| 4,211,893 | 7/1980 | Smith | 179/1 A |
| 4,345,502 | 8/1982 | Jahns | 84/1.21 |
| 4,347,405 | 8/1982 | Davis | 179/1 G |
| 4,422,360 | 12/1983 | Carter | 84/1.11 |
| 4,439,742 | 3/1984 | Sondermeyer | 330/262 |
| 4,532,476 | 7/1985 | Smith | 330/123 |
| 4,584,700 | 4/1986 | Scholz | 381/61 |
| 4,593,251 | 7/1986 | Smith | 330/123 |
| 4,600,891 | 7/1986 | Taylor, Jr. et al. | 330/10 |
| 4,672,671 | 6/1987 | Kennedy | 381/61 |
| 4,701,957 | 10/1987 | Smith | 381/61 |
| 4,713,624 | 12/1987 | Smith | 330/118 |
| 4,724,396 | 2/1988 | Taylor, Jr. et al. | 330/10 |
| 4,811,401 | 3/1989 | Brown, Sr. et al. | 381/61 |

Primary Examiner—James B. Mullins
Attorney, Agent, or Firm—Senniger, Powers, Leavitt & Roedel

[57] ABSTRACT

A first amplifier stage receives electrical signals generated by a musical instrument and provides an output signal. A second amplifier stage is driven by the output signal from the first amplifier stage as switch selectively connects an attenuator to the first amplifier stage to attenuate the output signal thereof and selectively connects a gain modifying circuit to the first stage. In a first mode, the attenuator is connected to the first amplifier stage and the gain modifying circuit is disconnected from the first amplifier stage. As a result, an output signal from the first amplifier stage has a level which drives the second amplifier stage to provide a substantially linear output signal therefrom. In a second mode, the attenuator is disconnected from the first amplifier stage and the gain modifying circuit is connected to the first amplifier stage. As a result, an output signal from the first amplifier stage has a level which will overdrive the second amplifier stage to provide a non-linear saturated signal therefrom having a first desired amount of increased harmonic saturation.

22 Claims, 5 Drawing Sheets

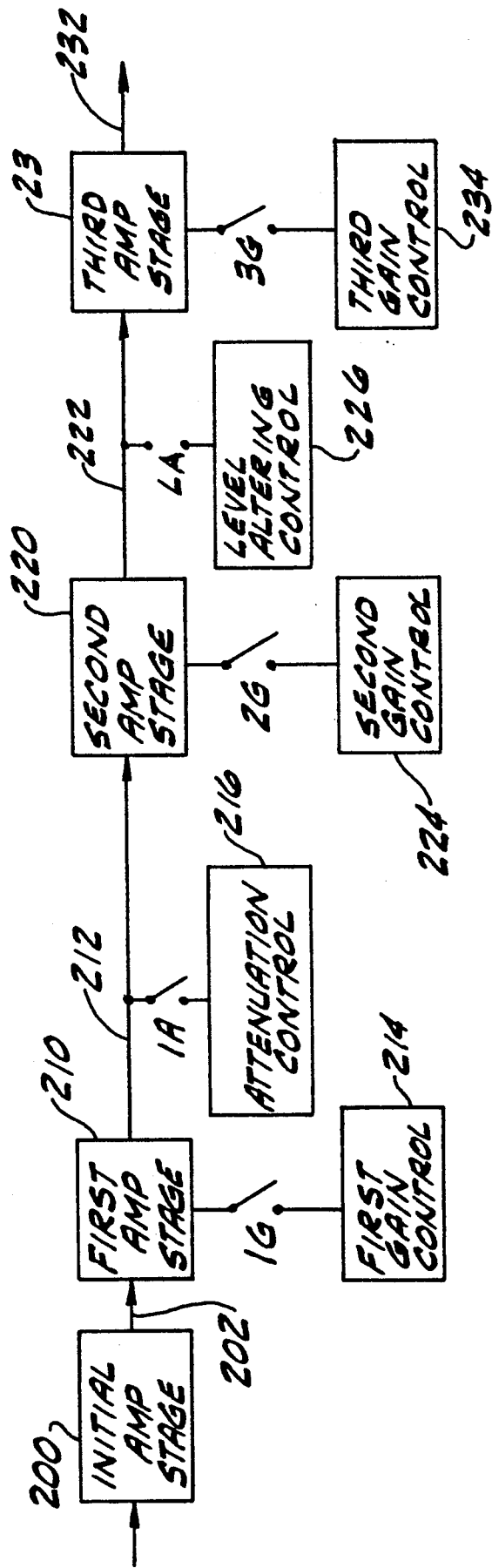

FIG. 4

SWITCHES

| MODES | LDR1 (19) | LDR2 (20) | LDR3 (21) | LDR4 (51) | LDR5 (52) | LDR6 (70) | LDR7 (72) | FET1 (39) (1G) | FET2 (47) (1A) | FET3 (46) (2G) | FET4 (63) (3G) | FET5 (65) |
|---|---|---|---|---|---|---|---|---|---|---|---|---|
| 1 | CLOSED | OPEN | OPEN | CLOSED | OPEN | OPEN | OPEN | OPEN | CLOSED | OPEN | OPEN | OPTIONAL BRIGHT |
| 2 | OPEN | CLOSED | OPEN | CLOSED | OPEN | CLOSED | OPEN | CLOSED | OPEN | CLOSED | OPEN | OPTIONAL BRIGHT |
| 3 | OPEN | OPEN | CLOSED | OPEN | CLOSED | OPEN | CLOSED | CLOSED | OPEN | CLOSED | CLOSED | N/A |

MULTI-STAGE MUSICAL INSTRUMENT AMPLIFIER HAVING DISTORTION MODES

FIELD OF THE INVENTION

This invention relates to an electronic amplifier for musical instruments and, in particular, a multi-stage musical instrument preamplifier having modes which selectively provide clean and undistorted signals, or signals with desired amounts of harmonic content.

BACKGROUND OF THE INVENTION

Many musicians now prefer vacuum tube preamplifiers and particularly those which can provide, as desired, linear or clean undistorted amplification or amplification which is non-linear or distorted with desired amounts of harmonic content. In part, it is believed that having a controlled amount of distortion when desired provides amplified sound that is more pleasing to the human ear and has a richer, fuller tone. As only particular passages of music are to be reproduced with non-linear or distorted sound characteristics, amplifiers which can be alternately operated in distorted and undistorted modes have been developed.

This has been accomplished in several ways such as using extra amplification stages or a different set of amplification stages to provide a distorted signal. In such arrangements there will be amplification stages which are not used in every mode of operation. As even clean undistorted music signals can benefit from having more amplification stages over the minimum needed for voltage gain it would be advantageous and efficient to have musical instrument amplifiers having multiple stages and having various modes of operation, some of which provide distortion, which use all of the stages of the amplifier in all modes of operation.

SUMMARY OF THE INVENTION

It is an object of this invention to provide a multi-stage musical instrument amplifier operating with distorted and undistorted modes with each mode using all stages of the amplifier.

It is another object of this invention to provide a preamplifier which has selectable modes of operation.

It is another object of this invention to provide a multi-stage musical instrument amplifier having multiple modes of operation which takes advantage of the characteristics of the amplifier stages in each mode.

It is another object of this invention to provide a multi-stage musical instrument amplifier having various modes of operation in which separate tone and volume controls are provided for each mode of operation.

In one form, the invention is a preamplifier for audio frequency electrical signals generated by a musical instrument such as a guitar. A first amplifier stage receives electrical signals generated by the musical instrument and provides an output signal. A second amplifier stage is driven by the output signal from the first amplifier stage. Means are provided for attenuating the output signal of the first amplifier stage. Gain modifying means are provided for the first amplifier stage. Switch means selectively connects the attenuating means to the first amplifier stage and selectively connects the gain modifying means to the first amplifier stage. In a first mode, an output signal from the first amplifier stage has a level which drives the second amplifier stage to provide a substantially linear output signal therefrom. In a second mode, an output signal from the first amplifier stage has a level which will overdrive the second amplifier stage to provide a nonlinear saturated signal therefrom having a first desired amount of increased harmonic content.

Other objects and features will be in part apparent and in part pointed out hereinafter.

BRIEF DESCRIPTION OF THE DRAWINGS

In the accompanying drawings, in which one of various possible embodiments of the invention is illustrated, FIG. 1 is a block diagram of one preferred embodiment of the preamplifier of the invention.

FIG. 2 is a table illustrating the preferred modes of operation of the invention indicating the status, open (O) or closed (C), of each of the switches of FIG. 1 for each mode of operation.

FIG. 4 is a table illustrating the preferred modes of operation of the invention as illustrated in FIG. 3.

Corresponding reference characters indicate corresponding parts through the drawing.

DETAILED DESCRIPTION OF PREFERRED EMBODIMENTS

Figure 3A:
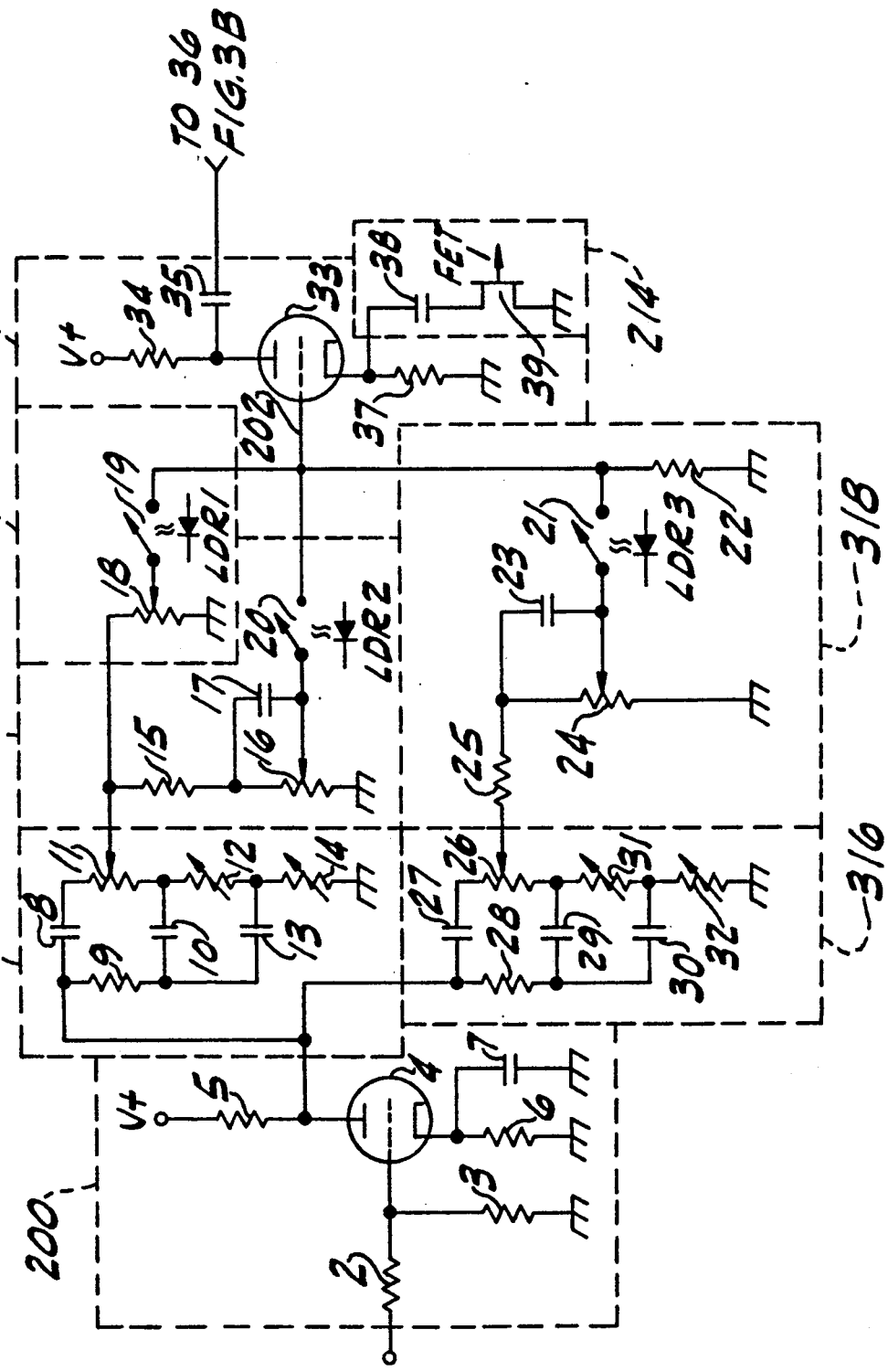
FIG. 3 is a schematic diagram of one preferred embodiment of a tube amplifier according to FIG. 1.

Referring to FIG. 1, a block diagram of a preamplifier for audio frequency electrical signals generated by a musical instrument such as a guitar is illustrated. After being amplified by an initial amplifier stage 200, the amplifier audio frequency electrical signal is supplied via line 202 to a first amplifier stage 210 which receives the amplified electrical signals generated by the musical instrument and provides an output signal via line 212. Gain modifying means is provided for first amplifier stage 210 in the form of a first gain control 214 selectively connected by switch 1G to the first amplifier stage 210. The output signal provided via line 212 is selectively attenuated by attenuation control 216 which is selectively connected to the output of the first stage 210 by switch 1A.

Second amplifier stage 220 is driven by the selectively attenuated output signal from first stage 210. The output of a second stage 220 is supplied to line 222. As illustrated in FIG. 2, in a first mode of operation which provides a normal or clean signal via second stage output line 222, switch 1G is open and switch 1A is closed so that the first stage 210 is not connected to first gain control 214 and output line 212 is connected to attenuation control 216. Therefore, the gain of the first stage 210 is not increased and the signal on output line 212 is attenuated by attenuation control 216. As a result, the output signal from the first stage 210 has a level which drives the second stage 220 to provide a substantially linear output signal therefrom. In a second mode of operation to provide low distortion, switch 1G is closed and switch 1A is open so that the gain of the first stage 210 is increased and its output is not attenuated. As a result, in the second mode the output signal from first stage 210 has a level which will overdrive the second stage 220 to provide a non-linear saturated signal therefrom having a first desired amount of increased harmonic content. In the third mode of operation, the switches 1A and 1G are in the same condition as the second mode so that operation in the third mode is the same as the second mode for a two stage amplifier. It is also contemplated that, in another mode of operation to provide very low distortion (not illustrated in FIG. 2), switches 1G and 1A are both closed to increase the gain of the first stage 210 but attenuate its output. As a result, in this very low distortion mode, the output signal from the first stage 210 has a level which will overdrive the second stage 220 to supply a non-linear saturated signal therefrom having a desired amount of increased harmonic content less than the first desired amount of increased harmonic content provided in the second mode.

Figure 5:
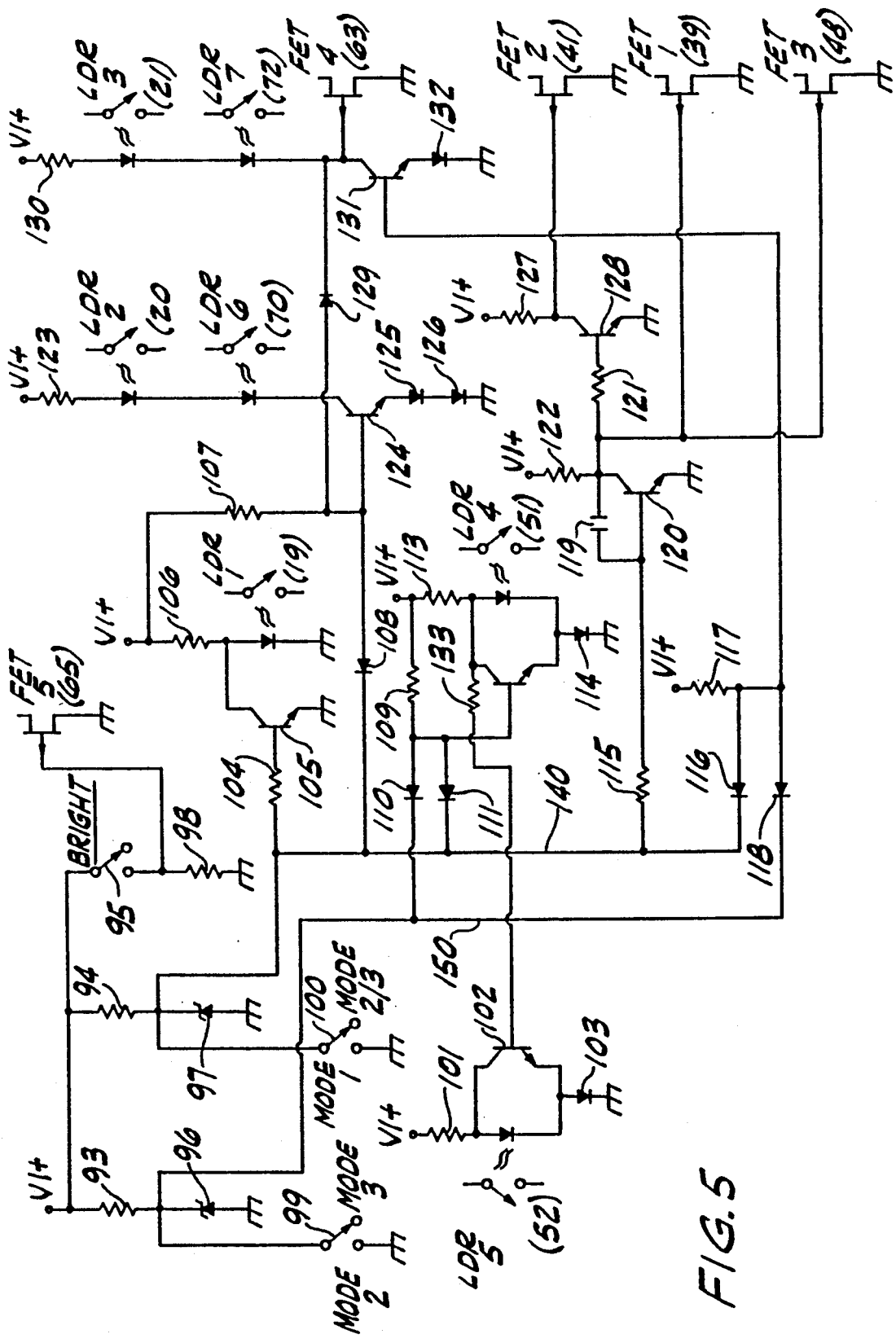
FIG. 5 is a schematic diagram of the switching circuitry of the embodiment illustrated in FIG. 3.

Switches 1G and 1A constitute switch means for selectively connecting the attenuating control 216 to the first stage 210 and for selectively connecting the first gain control 214 to the first stage 210. As illustrated in FIG. 5 and discussed below, means for controlling switches 1G and 1A are provided so that the switches are operated to accomplish the various modes of operation. In particular, a first mode is provided in which all stages are active, i.e. all stages provide an increase in power to supply a substantially linear signal as the output signal on line 222. A second mode is also provided in which all stages are active to supply a substantially nonlinear saturated signal with increased harmonic content as the output signal on line 222.

Referring again to FIG. 1, the preamplifier may include a third amplifier stage 230 adapted to be driven by the output signal from the second stage 220 provided via line 222. Second gain modifying means for the second amplifier stage 220 is also provided in the form of second gain control 224 selectively connected to second stage 220 by switch 2G. Means for altering the level of the output signal of the second stage 220 is also provided in the form of level altering control 226 selectively connected to output line 222 via switch LA.

In this three-stage configuration, in the first mode the output signal from the second stage 220 is configured to have a level which drives the third stage 230 to provide a substantially linear output signal therefrom via line 232. In the second mode, the output signal from second stage 220 is configured to have a level which will overdrive the third stage 230 to provide a non-linear saturated signal therefrom via output 232 with a first desired amount of increased harmonic content. It is contemplated that the amount of harmonic content in this second mode may or may not correspond to the amount of harmonic content provided in the two-stage configuration by the output of second stage 220. In the third mode of operation, the output signal from second stage 220 has a level which will overdrive the third stage 230 to provide a nonlinear saturated output signal therefrom with a desired amount of increased harmonic content greater than the first desired amount of increased harmonic content provided in the second mode.

These modes of operation for the three-stage configuration are accomplished as illustrated in FIG. 2. In particular, in the first or normal mode of operation wherein a clean signal is provided by the output of third stage 230, switch 2G is open to disconnect second gain control 224 avoiding increased gain of the second stage 220. Switch LA is closed to connect level altering control to output 222 to reduce the level of the output signal provided from second stage 220 to third stage 230. In the second mode, low distortion is provided by the output of the third stage 230 by closing switch 2G to increase the gain of the second stage thereby increasing the magnitude of the signal provided via line 222 to overdrive third stage 230. In the second mode, switch LA remains closed to somewhat reduce the level of the signal provided to third stage 230. In the third mode, to accomplish high distortion, switch 2G remains closed and switch LA is opened so that the level of the signal provided via line 222 is not reduced by level altering control 226 and a fully overdriving signal is provided to third stage 230.

In general, level altering control may be any circuit or network for altering the level of the output of second stage 220 as provided via line 222. Level altering control 226 may be means connected to the output of second stage 220 for selectively changing the resistive loading on the second stage 220 thereby changing both the gain and harmonic characteristics of the second stage.

Third stage 230 may be optionally provided with a third gain modifying means in the form of third gain control 234 selectively connected to third stage 230 via switch 3G. As illustrated in FIG. 2, third gain control 234 is connected to the third stage 230 to increase the gain thereof only during the third mode to further enhance the harmonic characteristics provided via output line 232.

Figure 3B:
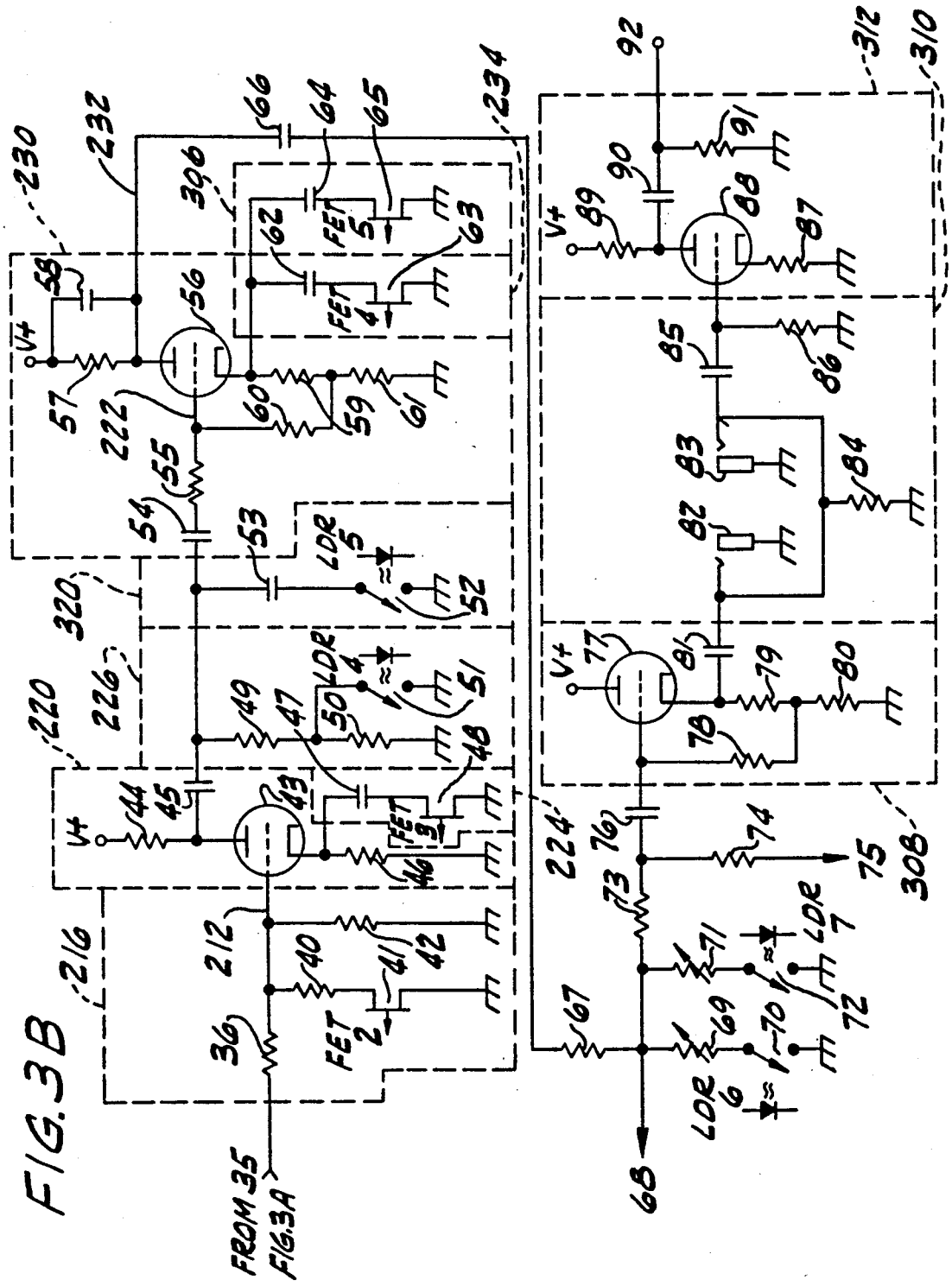

FIG. 3 illustrates a schematic diagram of one preferred embodiment of the preamplifier of the invention employing vacuum tube stages. It has been found that even a clean (undistorted) guitar signal, such as provided in mode one, benefits from a multitude of stages over the minimum number needed for voltage gain. The benefit is primarily due to the characteristics of the added tubes themselves. Therefore, it has been found that it is beneficial to use many stages for all modes and not simply add stages for an over driven sound as has been done in the prior art. The preamplifier according to the invention utilizes this approach by using all stages in all modes and by controlling tone, levels and gains throughout the circuit to obtain the desired sounds from the output in the various modes.

In FIG. 3, the same reference characters have been used as the reference characters of FIG. 1 wherever possible. FIG. 3 will be described according to various modes of operation. The position of the light dependent resistors (LDR) and the field effect transistors (FET) which make up the switches for the various modes is illustrated in FIG. 4. FIG. 5 illustrates one embodiment of the circuitry for controlling these switches.

Referring to FIG. 3, the audio-frequency electrical signal, such as a guitar pickup signal is supplied to input 1 and is amplified by initial amplifier stage 200 including an amplification stage tube 4. The input signal is provided to the control grid of tube 4 via the resistive divider formed by resistors 2 and 3. The gain of tube 4 is controlled by cathode resistor 6 and cathode capacitor 7 in parallel therewith. The V+ voltage is applied to the anode of tube 4 via anode resistor 5. In mode one, switch 19 is closed so that mode one/two tone control 302 and mode one volume control 304 are in line between the output of initial stage 200 and the input 202 to the first stage 210. Switches 20 and 21 are open so that mode two volume control 314, mode three tone control 316 and mode three volume control 318 are not in the circuit. Tone control 302 includes an RC network of resistor 9, capacitors 8, 10 and 13, variable resistors 12 and 14 and resistive divider 11. Mode one volume control 304 includes resistive divider 18 which is manually controlled by the amplifier operator to adjust volume.

First amplifier stage 210 includes first gain stage tube 33 for providing tone control recovery. The input signal provided via line 202 is applied to the grid of tube 33. The gain of tube 33 is controlled by cathode resistor 37. Switch 39 is open so that capacitor 38 does not affect the gain of tube 33. The V+ voltage is supplied via anode resistor 34 to provide an output via DC isolating and coupling capacitor 35.

Attenuation control 216 is active in mode one to reduce the magnitude of the signal supplied to second amplifier stage 220 via line 212. In particular, FET 2 forms switch 41 which is closed in mode one. This results in resistor 40 being connected in parallel with resistor 42 to reduce the total effective resistance to ground and attenuate the signal on line 212. Resistor 36 forms a divider with resistors 40 and 42.

The attenuated signal is supplied via line 212 to the control grid of the second gain stage tube 43. The gain of tube 43 is controlled by cathode resistor 46. The V+ voltage is applied to its anode via anode resistor 44 to provide a DC isolated output via capacitor 45. In the first mode, switch 48 is open so that capacitor 47 does not affect the gain of tube 43 and LDR 4 is illuminated to close switch 51 to bypass resistor 50. In general, the resistance of resistor 50 is much larger than the resistance of resistor 49 and the resistance of resistor 49 is less than the resistance of anode resistor 44. Accordingly, when resistor 50 is bypassed by closing of switch 51, the resistive loading on tube 43 is changed thereby reducing the gain and changing the harmonic characteristics thereof. In other words, switch 51 is closed to provide extra load on tube 43 to keep the gain thereof low. In the first mode, switch 52 is open so that capacitor 53 does not affect the second stage output.

The second stage output signal is supplied via capacitor 54 and resistor 55 to a third stage amplifier tube 56. A grid resistor 60 interconnects the control grid of tube 56 to a junction between a cathode biasing resistors 59 and 61. In mode one, the gain of tube 56 is determined by cathode resistors 59 and 61. Optional bright circuit 306 may be used in modes one or two by turning on FET 5 functioning as switch 65. This results in shunt connecting capacitor 64 across cathode resistors 59 and 61 increasing the high frequency amplification gain characteristics of tube 56. Switch 63 is open in mode one so that capacitor 62 does not affect the gain of tube 56.

The output of the third stage 230 is supplied via line 232 through capacitor 66 and resistor 67 to coupling point 68 for driving a standard reverberation circuit. The return and mixing point for the reverb return is at connection 75 via resistor 74. This reverberation connection may be used in any mode of operation. Switches 70 and 72 are open in mode one so that variable resistors 69 and 71 do not affect the third stage output.

The remainder of the circuit is employed in all modes of operation. The third stage output signal is supplied through resistor 73 and capacitor 76 to buffer stage 308 including cathode follower tube 77 for isolating the gain stages. The input signal is provided to the control grid of tube 77 with the V+ being directly applied to the anode. The circuit includes cathode resistors 79 and 80 and grid resistor 78. The buffer stage output is provided via capacitor 81 to patch point 310. Buffer 308 permits patching between connectors 82 and 83 at nominal line level. When not in use, the output signal is provided past grounded resistor 84, through capacitor 85, and past grounded resistor 86 to the gain recovery stage 312. Gain recovery tube 88 has a control grid for receiving the input signal. The gain of tube 88 is set by cathode resistor 87. The output includes V+ applied through anode resistor 89 to provide an output signal via DC isolating and coupling capacitor 90 and past resistor 91 to output 92.

Referring to FIG. 3 and the second mode of operation in which a low distortion signal is provided, mode one/two tone control 302 remains in the circuit. LDR 1 is deactivated to open switch 19 and disconnect mode one volume control 304. LDR 2 is illuminated to close switch 20 connecting mode two volume control 314. The signal provided via resistive divider 11 is provided through resistor 15 to resistive divider 16 which is manually controlled by the operator to adjust volume. Bypass capacitor 17 is a high frequency boost for low volume control settings. As a result, mode two has a completely independent gain control setting from mode one allowing different preset levels of drive signals to be provided to the following stages.

In mode two, the gain of the first amplifier stage 210 is increased by activating FET 1 functioning as switch 39 to connect capacitor 38 to the cathode of tube 33 and bypass resistor 37.

Switch 41 is opened by deactivating FET 2 to increase the resistance applied between the output of second stage 210 and ground. This reduces the attenuation of the second stage output without affecting the gain by increasing the resistance to ground in the voltage divider formed by resistors 36, 40 and 42. In general, resistor 40 has a lesser resistance than resistor 42.

The gain of tube 43 is increased in mode two by activating FET 3 functioning as switch 48 to close it and bypass cathode resistor 46 by capacitor 47. As a result, in mode two, the gain of tube 43 is increased so that the level of the signal supplied to tube 56 is increased. Tube 56 is overdriven depending in part, on the setting of mode two volume control 314 by resistive divider 16. When the preamplifier is used as a guitar preamplifier, this provides a "lead guitar" sound.

In mode two, LDR 6 is also illuminated to close switch 70 connecting grounded variable resistor 69 to the supply line carrying the output signal so that a different volume level for mode two can be achieved independent of the other modes of operation.

In mode three, LDR 1 and LDR 2 are deactivated to maintain switches 19 and 20 in an open position. LDR 3 is illuminated to close switch 21 thereby connecting mode three tone control 316 and mode three volume control 318 in series between initial amplifier 200 and first stage 210. Mode three tone control 316 includes an RC network of capacitors 27, 29 and 30, resistor 28, variable resistors 31 and 32 and resistive divider 26 which functions as a high frequency control. These controls operate over a different frequency range than the mode one/two tone controls. This enhances the operation of the preamplifier when one or more of the stages is overdriven. The signal provided by tone control 316 is supplied through resistor 25 to resistive divider 24. Divider 24 is adjusted or preset by the operator and functions as a mode three volume control. Bypass capacitor 23 provides a high frequency boost for low volume settings of divider 24.

In mode three, LDR 4 is deactivated to open switch 51 thereby removing the level reducing effect of level altering control 226 to the output of second stage 220. This results in an increase in the gain of second stage 220 and an increase in the output level thereof. LDR 5 is illuminated to close switch 52 thereby activating high frequency roll-off circuit 320. Grounded capacitor 53 is connected to the out put of second stage 220 providing high frequency roll-off to enhance the sound qualities of the sound stage output signal provided to third stage 230. Capacitor 53 introduces a high frequency roll-off to remove very high frequency distortion Products and to prevent possible squealing from the instrument. As a result of mode three, with increased gains and less attenuation, tubes 43 and 56 are easily overdriven for a very distorted "lead" sound, depending on the setting of volume control resistive divider 24. In addition, LDR 6 is deactivated to open switch 70 and LDR 7 is illuminated to close switch 72 connecting variable volume control resistor 71 to control the overall signal level independently of signal level controls for the other modes.

In mode three, the gain of tube 33 is maintained high by continuing to activate FET 1 thereby closing switch 39. The output of first stage 210 is not attenuated by deactivating FET 2 to maintain switch 41 in an open position. The gain of tube 43 is maintained high by activating FET 3 to maintain switch 48 in a closed position.

In order to increase the gain of tube 56, FET 4 is activated to close switch 63 thereby shunt-connecting capacitor 62 across the cathode resistors 59 and 61 of tube 56. Capacitor 64 is small enough to have no effect in this mode three of operation.

FIG. 5 is a schematic diagram of one preferred circuit for controlling the switches of FIG. 4. Switches 99 and 100 are manually operated separately so that in mode one, switch 100 is closed. The position of switch 99 does not affect the status of the circuit of FIG. 5 when switch 100 is closed. In mode two, switch 99 is closed and switch 100 is open. In mode three, both switches 99 and 100 are open. In mode one, the point between resistor 94 and Zener diode 97 is grounded so that bus 140 is grounded. In mode one, the status of bus 150 does not affect the circuit. In mode two, bus 150 is grounded and bus 140 is at the Zener voltage developed between resistor 94 and Zener diode 97. In mode three, bus 140 remains at the Zener voltage and bus 150 is at the Zener voltage developed between resistor 93 and diode 96.

In mode one, bus 140 is grounded so that the base of transistor 105 is pulled low through resistor 104 thereby turning off transistor 105. This permits the V1+ voltage to be applied through resistor 106 illuminating LDR 1 and closing switch 19. Transistor 124 is also turned off by grounding its base through diode 108 so that LDR 2 and LDR 6 are not illuminated. Therefore, switches 20 and 70 are open in mode one. Transistor 112 is turned off by pulling its base low through diode 111 so that the V1+ voltage is applied via resistor 113 to illuminate LDR 4 and close switch 51. Transistor 102 is in the opposite state to transistor 112 because it is controlled by the collector of transistor 112 via resistor 133. In mode one, the voltage across LDR 4 is applied through resistor 133 to turn it on thereby grounding the V1+ voltage through resistor 101 to prevent illumination of LDR 5 and keep switch 52 open. Transistor 120 is turned off because its base is pulled low through resistor 115. As a result, its collector is held high so that transistor 128 is turned on via resistor 121. Capacitor 119 slows down the switching time to prevent popping. Transistor 128 grounds the gate of FET 2 to close switch 41. The gates of FET 1 and FET 3 are high which opens switches 39 and 48. The base of transistor 131 is pulled low via diode 116 to turn it off preventing illumination of LDR 3 and LDR 7. This opens switches 21 and 72. FET 4 is thereby maintained in an open condition by the voltage applied to its gate via resistor 130.

In mode one, the status of bus 150 does not affect the status of the circuit of FIG. 5. If switch 99 is in the mode three position, as illustrated, bus 150 is at the Zener voltage of Zener diode 96. However, this does not affect the status of transistor 112 because its base is grounded through diode 111. This does not affect the status of transistor 131 because its base is grounded through diode 116. If switch 99 is in the mode two position and closed, then bus 150 is grounded. Once again, grounded bus 150 would not affect the status of transistors 112 and 131 because they are grounded.

In mode two, switch 99 is closed and switch 100 is open. Bus 140 is at the Zener voltage closing transistor 105 to bypass and prevent illumination of LDR 1 and open switch 19. The status of transistors 102 and 112 does not change because the base of transistor 112 is grounded through diode 110. Transistor 120 is turned on which results in turning off transistor 128 to apply a voltage to the gate of FET 2 via resistor 127 and open switch 41. Transistor 120 grounds the gates of FET 1 and FET 3 to close switches 39 and 48. The status of transistor 131 is not changed because its base is grounded through diode 118. Transistor 124 is turned on to actuate LDR 2 and LDR 6 thereby closing switches 20 and 70.

In mode three, both bus 140 and bus 150 are at their Zener voltages. Transistor 112 is turned on so that LDR 4 is not illuminated and transistor 102 if off so LDR 5 is illuminated. As a result, switch 51 is open and switch 52 is closed. Transistor 131 is turned on so that LDR 3 and LDR 7 are illuminated to close switches 21 and 72. The gate of FET 4 is grounded to close switch 63. Diode 129 pulls the base of transistor 124 low turning off transistor 124 and preventing illumination of LDR 2 and LDR 6 to open switches 20 and 70.

In modes one or two of operation, switch 95 may be opened to ground the gate of FET 5 thereby closing switch 65 and actuating bright circuit 306.

Although the switches have been illustrated as electronic switches, it is contemplated that any type of switch, such as a mechnical switch, may be used in accordance with this invention. In addition, although this invention has been described with respect to vacuum tubes, it is contemplated that the invention may be implemented by solid-state devices.

In view of the above, it will be seen that the several objects of the invention are achieved and other advantageous results attained.

As various changes could be made in the above constructions without departing from the scope of the invention, it is intended that all matter contained in the above description and shown in the accompanying drawings shall be interpreted as illustrative and not in a limiting sense.

What is claimed is:

1. In a preamplifier for audio frequency electrical signals generated by a musical instrument such as a guitar:

a first amplifier stage for receiving electrical signals generated by the musical instrument and providing an output signal;

a second amplifier stage adapted to be driven by the output signal from the first amplifier stage;

means for attenuating the output signal of the first amplifier stage;

gain modifying means for the first amplifier stage; and switch means for selectively connecting the attenuating means to the first amplifier stage and for selectively connecting the gain modifying means to the first amplifier stage to provide in a first mode an output signal from the first amplifier stage having a level which drives the second amplifier stage to provide a substantially linear output signal therefrom and to provide in a second mode an output signal from the first amplifier stage having a level which will overdrive the second amplifier stage to provide a nonlinear saturated signal therefrom having a first desired amount of increased harmonic content.

2. In the preamplifier of claim 1, said switch means comprising a first switch for selectively connecting the attenuating means to the first amplifier stage and a second switch for selectively connecting the gain modifying means to the first amplifier stage, and which further includes means for controlling said first and second switches whereby in the first mode the attenuating means is connected to the first amplifier stage and the gain modifying means is disconnected from the first amplifier stage and in the second mode the attenuating means is disconnected from the first amplifier stage and the gain modifying means is connected to the first amplifier stage.

3. In the preamplifier of claim 1, said first amplifier stage comprising an electron discharge device having a control grid, an anode, a cathode and a cathode resistor and wherein said gain modifying means comprises means for selectively shunt-connecting a capacitor across at least a portion of the cathode resistor.

4. In the preamplifier of claim 3, said attenuating means comprising a resistance adapted to be selectively connected across the output circuit of the first amplifier stage.

5. In the preamplifier of claim 1, further comprising means for modifying, for each mode of operation, the output level of the second amplifying stage.

6. In the preamplifier of claim 5, the modifying means comprising a first mode volume control and a second mode volume control; said switch means comprising a first switch for selectively connecting the attenuating means to the first amplifier stage, and a second switch for selectively connecting the gain modifying means to the first amplifier stage; which further includes a third switch for selectively activating the first mode volume control, and a fourth switch for selectively activating the second mode volume control, and which further includes means for controlling said first, second third and fourth switches whereby in the first mode the attenuating means is connected to the first amplifier stage, the gain modifying means is disconnected from the first amplifier stage, the first mode volume control is activated and the second mode volume control is deactivated and in the second mode the attenuating means is disconnected from the first amplifier stage, the gain modifying means is connected to the first amPlifier stage, the first mode volume control is deactivated and the second mode volume control is activated.

7. In the preamplifier of claim 1, further comprising means for controlling, for each mode of operation, the frequency response of the output signal of the second amplifying stage.

8. In the preamplifier of claim 7, further comprising a first mode tone control and a second mode tone control; said switch means comprising a first switch for selectively connecting the attenuating means to the first amplifier stage, and a second switch for selectively connecting the gain modifying means to the first amplifier stage; which further includes a third switch for selectively activating the first mode tone control and a fourth switch for selectively activating the second mode tone control, and which further includes means for controlling said first, second, third and fourth switches whereby in the first mode the attenuating means is connected to the first amplifier stage, the gain modifying means is disconnected from the first amplifier stage, the first mode tone control is activated and the second mode tone control is deactivated and in the second mode the attenuating means is disconnected from the first amplifier stage, the gain modifying means is connected to the first amplifier stage, the first mode tone control is deactivated and the second mode tone control is deactivated.

9. In a preamplifier for audio frequency electrical signals generated by a musical instrument such as a guitar:
a first amplifier stage for receiving electrical signals generated by the musical instrument and providing an outPut signal;
a second amplifier stage adapted to be driven by the output signal from the first amplifier stage;
a third amplifier stage adapted to be driven by the output signal from the second amplifier stage;
means for attenuating the output signal of the first amplifier stage;
first gain modifying means for the first amplifier stage;
means for altering the level of output signal of the second amplifier stage;
second gain modifying means for the second amplifier stage; and switch means for selectively connecting the attenuating means to the first amplifier stage, for selectively connecting the level altering means to the second amplifier stage, for selectively connecting the first gain modifying means to the first amplifier stage, and for selectively connecting the second gain modifying means to the second amplifier stage to provide in a first mode an output signal from the second amplifier stage having a level which drives the third amplifier stage to provide a substantially linear output signal therefrom and to provide in a second mode an output signal from the second amplifier stage having a level which will overdrive the third amplifier stage to provide a nonlinear saturated signal therefrom with a first desired amount of increased harmonic content.

10. In the preamplifier of claim 9, said switch means comprising a first switch for selectively connecting the attenuating means to the first amplifier stage, a second switch for selectively connecting the first gain modifying means to the first amplifier stage, a third switch for selectively connecting the level altering means to the second amplifier stage, a fourth switch for selectively connecting the second gain modifying means to the second amplifier stage, and which further includes means for controlling said first, second, third and fourth switches whereby in the first mode the attenuating means is connected to the first amplifier stage, the first gain modifying means is disconnected from the first amplifier stage, the level altering means is connected to the second amplifier stage and the second gain modifying means is disconnected from the second amplifier stage, and in the second mode the attenuating means is disconnected from the first amplifier stage, the first gain modifying means is connected to the first amplifier stage, the level altering means is connected to the second amplifier stage and the second gain modifying means is connected to the second amplifier stage.

11. In the preamplifier of claim 10, said switch means providing a third mode of operation in which an output signal from the second amplifier stage has a level which will overdrive the third amplifier stage to provide a nonlinear saturated output signal therefrom with a desired amount of increased harmonic content greater than the first desired amount of increased harmonic content.

12. In the preamplifier of claim 11, said controlling means controlling said first, second, third and fourth switches whereby in the third mode of operation the attenuating means is disconnected from the first amplifier stage, the first gain modifying means is connected to the first amplifier stage, the level altering means is disconnected from the second amplifier stage and the second gain modifying means is connected to the second amplifier stage.

13. In the preamplifier of claim 9, said first amplifier stage comprising a first electron discharge device having a control grid, an anode, a cathode and a first cathode resistor and said second amplifier stage comprises a second electron discharge device having a control grid, an anode, an anode resistor, a cathode and a second cathode resistor and wherein the first gain modifying means comprises means for selectively shunt-connecting a capacitor across at least a portion of the first cathode resistor and said second gain modifying means comprises means for selectively shunt-connecting a capacitor across at least a portion of the second cathode resistor.

14. In the preamplifier of claim 13, wherein said level altering means further comprises means connected across the output circuit of the second amplifier stage for selectively changing the resistive loading on said second amplifier stage thereby changing the gain and the harmonic characteristics thereof.

15. In the preamplifier of claim 14, the means connected across the output circuit of the second amplifier stage comprising a resistor having a resistance which is less than that of said anode resistor.

16. In the preamplifier of claim 9, further comprising third gain modifying means for the third amplifier stage and wherein said switch means further comprises means for selectively connecting the third gain modifying means to the third amplifier stage.

17. In the preamplifier of claim 16, said switch means comprising a first switch for selectively connecting the attenuating means to the first amplifier stage, a second switch for selectively connecting the first gain modifying means to the first amplifier stage, a third switch for selectively connecting the level altering means to the second amplifier stage, a fourth switch for selectively connecting the second gain modifying means to the second amplifier stage, a fifth switch for selectively connecting the third gain modifying means to the third amplifier stage and which further includes means for controlling said first, second, third, fourth and fifth switches whereby in the first mode the attenuating means is connected to the first amplifier stage, the first gain modifying means is disconnected from the first amplifier stage, the level altering means is connected to the second amplifier stage, the second gain modifying means is disconnected from the second amplifier stage, and the third gain modifying means is disconnected from the third amplifier stage and in the second mode the attenuating means is disconnected from the first amplifier stage, the first gain modifying means is connected to the first amplifier stage, the level altering means is connected to the second amplifier stage, the second gain modifying means is connected to the second amplifier stage and the third gain modifying means is disconnected from the third amplifier stage.

18. In the preamplifier of claim 17, said switch means providing a third mode of operation in which an output signal from the second amplifier stage has a level which will overdrive the third amplifier stage to provide a nonlinear saturated output signal therefrom with a desired amount of increased harmonic content greater than the first desired amount of increased harmonic content.

19. In the preamplifier of claim 18, said controlling means controlling said first, second, third, fourth and fifth switches whereby in the third mode of operation the attenuating means is disconnected from the first amplifier stage, the first gain modifying means is connected to the first amplifier stage, the level altering means is disconnected from the second amplifier stage, the second gain modifying means is connected to the second amplifier stage and the third gain modifying means is connected to the third amplifier stage.

20. In the preamplifier of claim 19, wherein said level altering means comprises means connected to the output of the second amplifier stage for selectively changing the resistive loading on said second amplifier stage thereby changing the gain and the harmonic characteristics thereof.

21. In the preamplifier of claim 9, further comprising a buffer stage adapted to receive the output of the third amplifier stage and provide a buffered output signal corresponding thereto.

22. A preamplifier for audio frequency electrical signals generated by a musical instrument such as a guitar, said preamplifier comprising:
 a plurality of cascaded amplifier stages for receiving electrical signals generated by a musical instrument and providing an output signal;
 means for selectively attenuating the output of one or more of the stages;
 means for selectively modifying the gain of one or more of the stages;
 means for selectively activating the attenuating means and modifying means to provide a first mode in which all stages provide an increase in power to supply a substantially linear signal as the output signal and to provide a second mode in which all stages provide an increase in power to supply a substantially nonlinear saturated signal with increased harmonic content as the output signal.

* * * * *